United States Patent
O'Malley et al.

(10) Patent No.: US 7,627,032 B2
(45) Date of Patent: Dec. 1, 2009

(54) DIGITAL PULSE WIDTH MODULATOR

(75) Inventors: Eamon O'Malley, County Mayo (IE); Karl Rinne, County Cork (IE)

(73) Assignee: Powervation Limited, Co. Limerick (IE)

( * ) Notice: Subject to any disclaimer, the term of this patent is extended or adjusted under 35 U.S.C. 154(b) by 338 days.

(21) Appl. No.: 11/337,448

(22) Filed: Jan. 24, 2006

(65) Prior Publication Data

US 2006/0214712 A1    Sep. 28, 2006

Related U.S. Application Data

(63) Continuation of application No. PCT/IE2004/000101, filed on Jul. 26, 2004.

(30) Foreign Application Priority Data

Jul. 25, 2003    (IE)    ................................. 2003/0552

(51) Int. Cl.
    *H03K 7/08*    (2006.01)
(52) U.S. Cl. .................................................... 375/238
(58) Field of Classification Search ................. 375/238; 327/31
    See application file for complete search history.

(56) References Cited

U.S. PATENT DOCUMENTS

| 5,594,631 | A | | 1/1997 | Katoozi et al. ................. 363/41 |
| 5,602,464 | A | * | 2/1997 | Linkowsky et al. ......... 323/272 |
| 6,038,265 | A | * | 3/2000 | Pan et al. ..................... 375/316 |
| 6,538,523 | B2 | * | 3/2003 | Sugita et al. ................. 332/109 |

FOREIGN PATENT DOCUMENTS

| WO | WO03/005779 | 1/2003 |
| WO | WO03/050637 | 6/2003 |

OTHER PUBLICATIONS

Dancy et al, IEEE Trans . . . , vol. 8, No. 3, Jun. 2000, pp. 1-12, High-Efficiency Multiple-Output DC-DC Conversion for Low- . . . .

* cited by examiner

*Primary Examiner*—Kevin Y Kim
(74) *Attorney, Agent, or Firm*—Jacobson Holman PLLC

(57) ABSTRACT

A DPWM (1) has a delay lock loop (4) which receives an input clock signal and provides an out-of-phase delayed clock at the output of each of eight delay cells (35). A multiplexer (5) selects one of the delay cell outputs at any one time. This allows the DPWM (1) to have eight times the resolution which would otherwise be achieved with the same input clock. A programmable module (2) has a control block (20) which interfaces with external CPU and DSP hosts and transmits programmed parameters to finite state machine controllers (15), each providing an independent output.

24 Claims, 11 Drawing Sheets

DIGITAL PULSE WIDTH MODULATOR

This is a continuation of PCT/IE2004/000101 filed 26 Jul. 2004 and published in English.

FIELD OF THE INVENTION

The invention relates to digital pulse width modulators (DPWMs) for applications such as power supply control

PRIOR ART DISCUSSION

A DPWM generates a pulse width modulated (PWM) output signal which repeats over a fixed time interval called the switching period Ts (Ts=1/Fs). Generally, the PWM signal switches from a low to high logic state at the start of a switching period and toggles between a logic high and low state at a point in time during the switching period determined by the duty-cycle (the portion of the switching period for which the signal remains in the logic high state).

A clocked counter running at a frequency much greater than the PWM switching frequency determines the point at which the PWM changes logic state. For example, there may be a transition from high to low after 200 counter clock cycles and a toggle from low to high (start of a new switching period) at 1000 counter clock cycles. This gives a duty cycle d=200/1000=20%. Thus, the resolution of the DPWM is determined by the counter clocking frequency. In general the following relationship applies:

$$Fc = N*Fs$$

where Fc is the clock frequency, Fs is the output PWM switching frequency, and N is the number of counts in a switching period.

There is in general a trade-off between the competing requirements of decreasing the clock frequency to reduce power consumption and circuit cost on the one hand and increasing the clock frequency to improve resolution on the other hand. FIG. A shows an overall layout of a known counter/comparator DPWM for which the above trade-off is a major consideration.

Another known DPWM, known as a ring-oscillator-mux DPWM is shown in FIG. B. A problem with this type is that it requires in some circumstances a large number of delay buffers, or there is a tendency for the clock to become skewed. Also the size of the multiplexer grows exponentially with N (the number of bits resolution).

Referring to FIG. C a hybrid DPWM is shown. Again, however, some of the above problems can still arise. A counter/dithering DPWM is shown in FIG. D. However long dithering patterns can cause high output AC ripple which is superimposed on the ripple from the switching action of the PWM signal.

The invention is therefore directed towards providing an improved DPWM.

SUMMARY OF THE INVENTION

According to the invention, there is provided a DPWM comprising a counter and a comparator, characterised in that the DPWM further comprises a delay circuit for delaying a received clock signal to provide multiple clock phases to simulate a higher frequency clock.

In one embodiment, the delay circuit comprises a delay-locked loop circuit having a plurality of delay cells each providing a clock phase transition within the received clock period.

In another embodiment, the DPWM further comprises a multiplexer for selecting a phase from the delay circuit and providing it to an output control block.

In a further embodiment, the counter/comparator functionality is incorporated in a programmable module.

In one embodiment, the module comprises a control block for interfacing with an external host, and a plurality of controllers for providing outputs.

In another embodiment, the controllers are state machines.

In a further embodiment, each of the controllers operates independently to provide a PWM output based on parameters from the control block.

In one embodiment, the programmable module further comprises a component to provide an ADC sample and hold output signal.

In another embodiment, an ADC sample and hold signal is produced from a pre-programmed control register when the duty-cycle value is zero.

In a further embodiment, the programmable module forces all PWM outputs to zero in less than 1 ns in response to an asynchronous stop input.

In one embodiment, the duty-cycle can be clamped to programmable minimum and maximum values.

In another embodiment, the module generates multiple PWM outputs from programmed parameters.

In a further embodiment, the duty-cycle is programmable from 0-100%.

In one embodiment, the dead/delay times between the PWM outputs are programmable and are bit-wise accurate to a programmed resolution.

In another embodiment, the PWM output signals can be programmed to occur in a complementary or alternating sequence Mode 0 and Mode 1, respectively.

In a further embodiment, comprises a phase-locked loop to render the operating clock of the DPWM to be programmable.

In one embodiment, the operation of each DPWM controller is synchronous to an operating clock.

In another embodiment, the modulation type is programmable.

In a further embodiment, the programmed modulation types include trailing edge, leading edge, trailing triangle, and leading triangle.

In one embodiment, the duty-cycle can be programmed either from a host CPU or a discrete feedback controller.

In another embodiment, the resolution of the PWM signals are programmable from 6-12 bits.

In a further embodiment, the switching frequency range is from 100 KHz-15 MHz.

In one embodiment, the programmable module can work independently from the DLL to generate lower frequency/resolution switching frequencies yielding a true digital DPWM.

In another embodiment, the device can be programmed to enter a power-down mode.

In a further embodiment, the device can produce a synchronisation signal to other DPWM upon starting to generate PWM output signals.

The invention also provides a switching mode converter comprising a DPWM as defined above controlling a plurality of switches.

In one embodiment, the DPWM provides complementary made switch control outputs.

In another embodiment, the DPWM provides alternating mode switch control outputs.

DETAILED DESCRIPTION OF THE INVENTION

BRIEF DESCRIPTION OF THE DRAWINGS

The invention will be more clearly understood from the following description of some embodiments thereof, given by way of example only with reference to the accompanying drawings in which.

DESCRIPTION OF THE EMBODIMENTS

Figure 1:
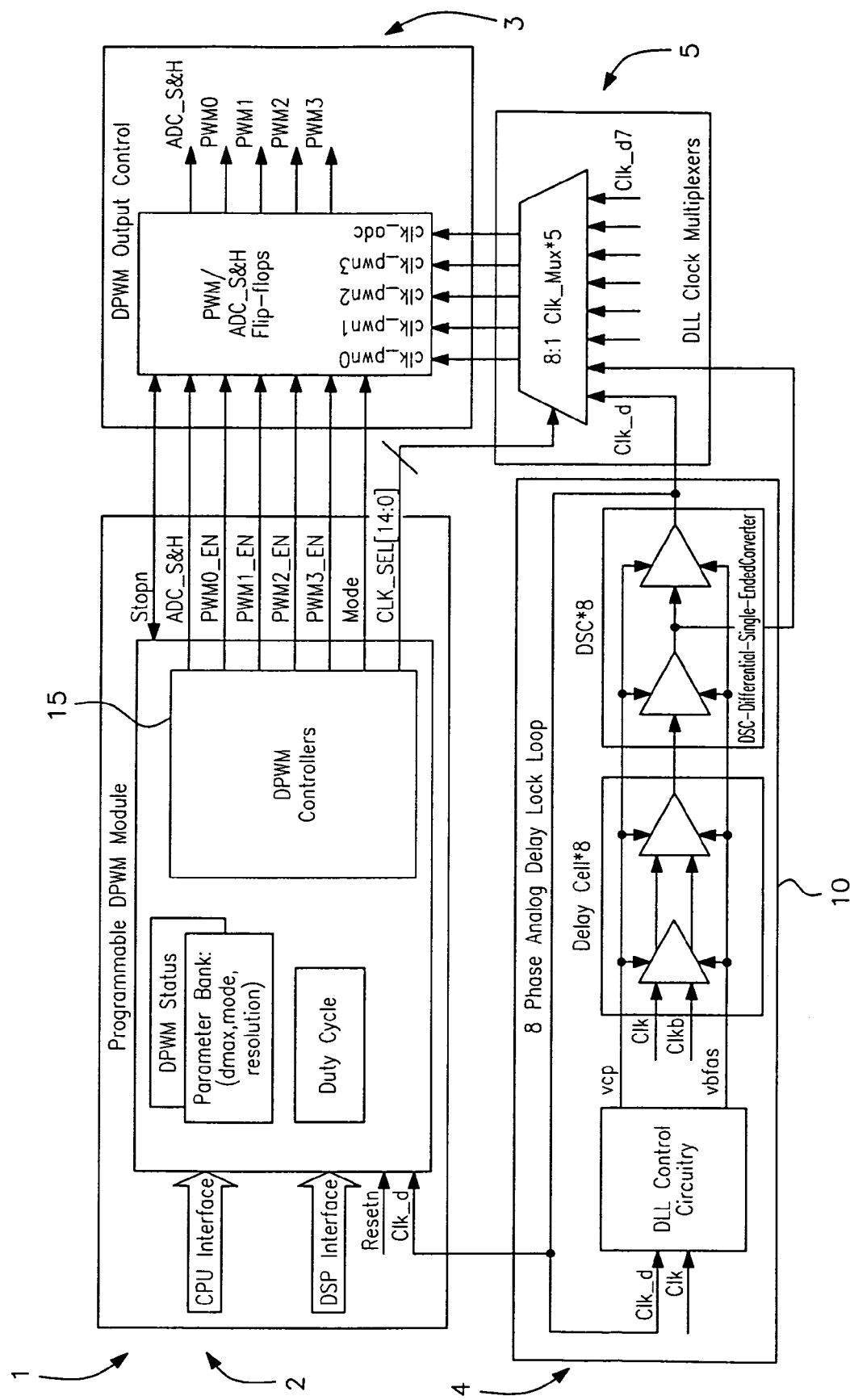
FIG. 1 is a block diagram of a DPWM of the invention.

Referring to FIG. 1 a DPWM 1 comprises a programmable DPWM module 2, an output control block 3, an analogue delay lock loop (DLL) 4, and clock multiplexers 5. The module 2 incorporates counter and comparator functionality and so the DPWM essentially is of the counter/comparator general type. However, as described in more detail below the DLL 4 pre-processes the input clock in a manner to considerably reduce required clock frequency. The overall DPWM 1 is a single CMOS chip in this embodiment.

Figure 5:
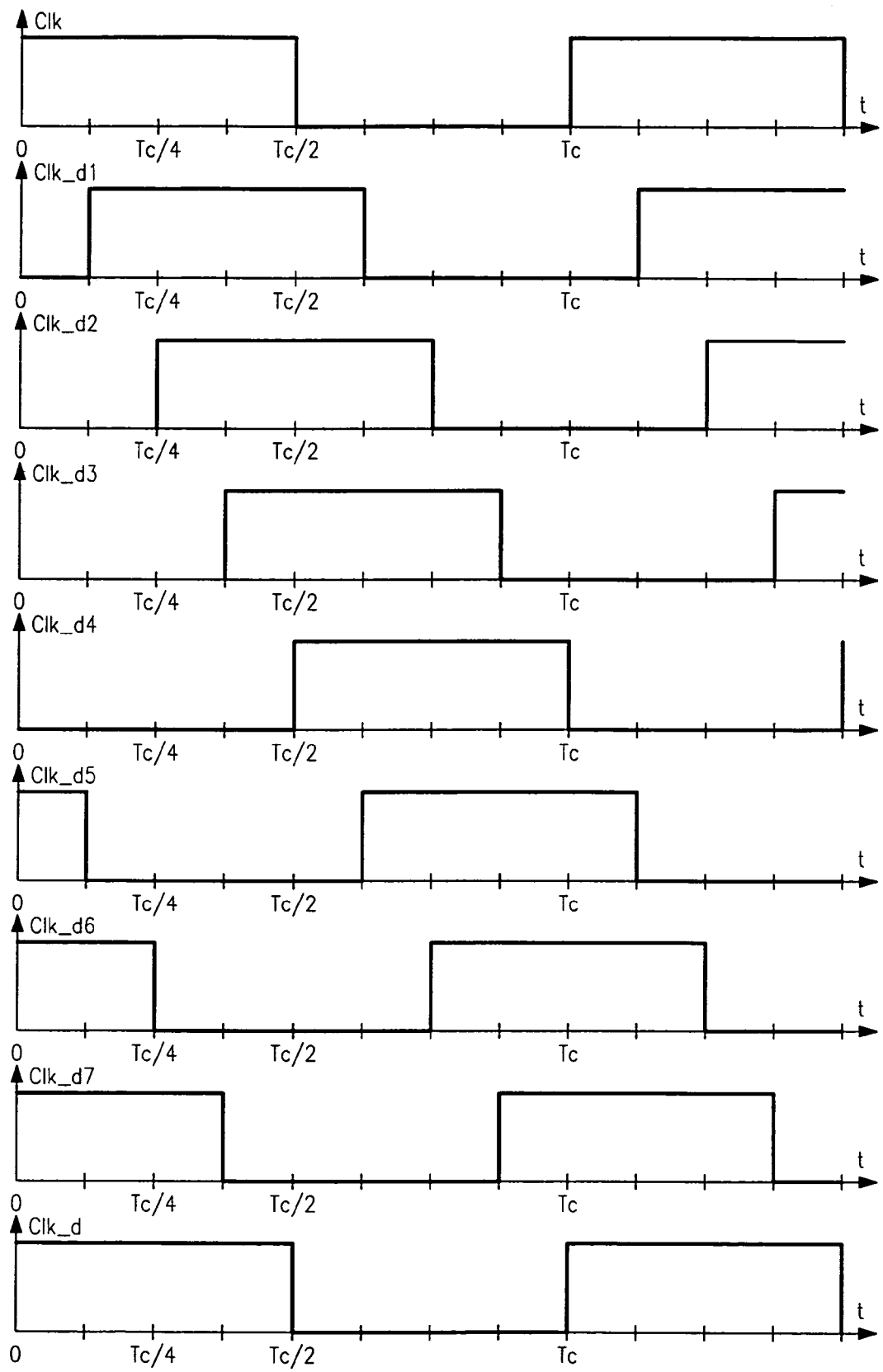
FIG. 5 shows a an input clock and individual delay stage output clocks.

This clock signal is fed to the input of the DLL 4. Assuming a DLL with M delay cells in the delay line, the DLL provides M delayed versions of the clock, one version at each delay cell output. In this example, M=8. Based on a control signal (three least significant bits of the duty cycle value) to the module 2, the multiplexer 5 chooses one of the delayed clock phases. Hence, without an increase in clock frequency, the time resolution has been increased by a factor of M. This is explained diagrammatically in FIG. 5. In particular, FIG. 5 shows the input clock Clk and the outputs of the eight delay cells in the same time dimension. Effectively, the delay cells allow the DPWM 1 to simulate a clock signal having eight times the frequency of the actual input clock.

Figure 2:
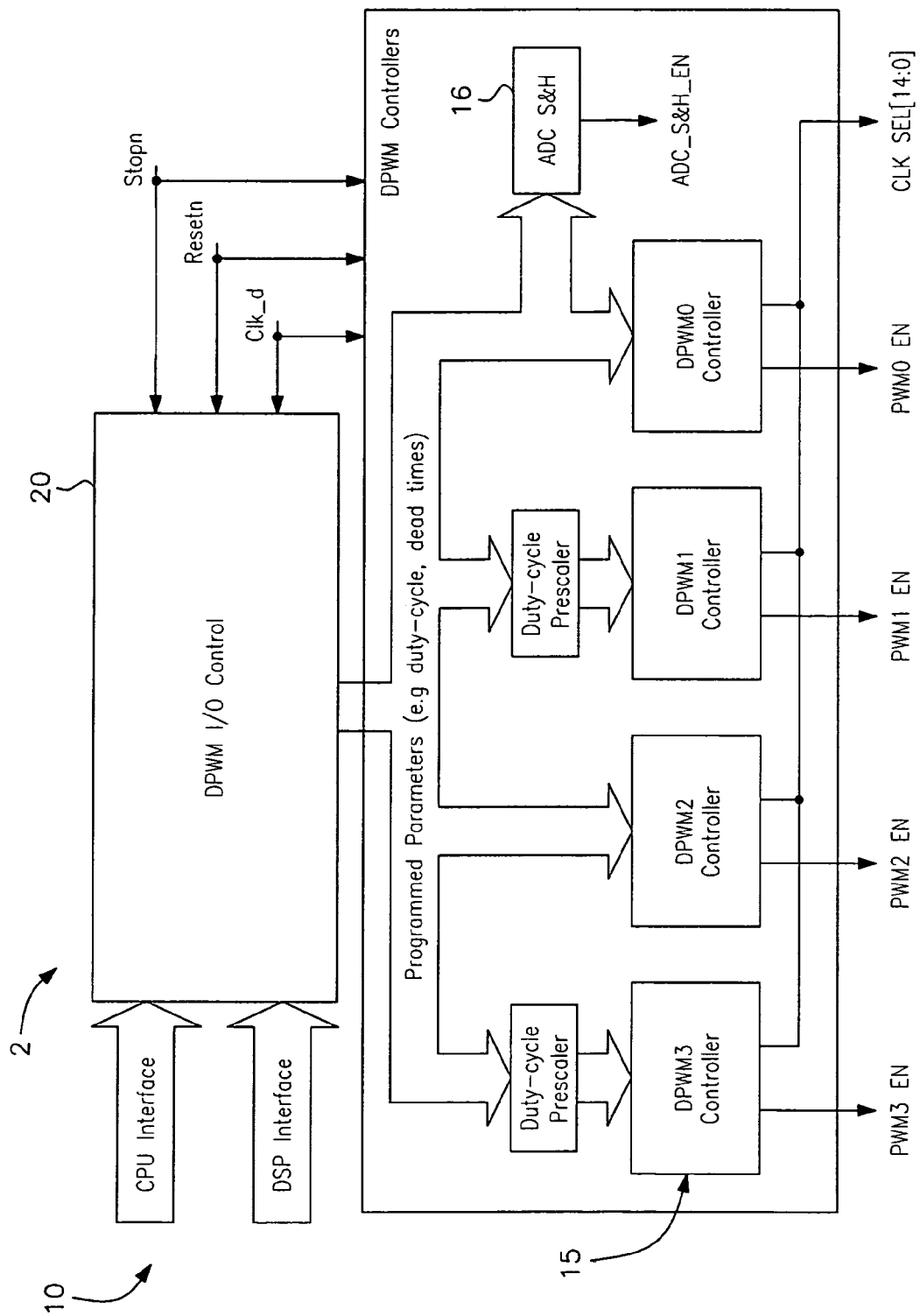
FIG. 2 is a block diagram of a programmable DPWM module of the DPWM.

Referring to FIG. 2 the module 2 is shown in more detail. DPWM controllers 15 within the module 2 can dynamically select a desired DLL clock phase to operate from based on the three least significant bits of the programmed dead and delay times for generating the additional PWM outputs. This allows the dead/delay times to be truly bit-wise accurate to the programmed resolution. A control block 20 receives external CPU and DSP instructions and routes programmed parameters to the controllers 15. The latter are effectively state machines, each of which independently generates an output. Thus the multiple outputs are not merely processed (e.g. inverted) versions of a single output. The control block 20 also feeds programmed parameters to an ADC sample and hold (S&H) function 16. The ADC S&H function 16 produces a sample and hold signal required by circuit blocks outside the DPWM 1 (such as an external analogue-digital converter).

Figure 3:
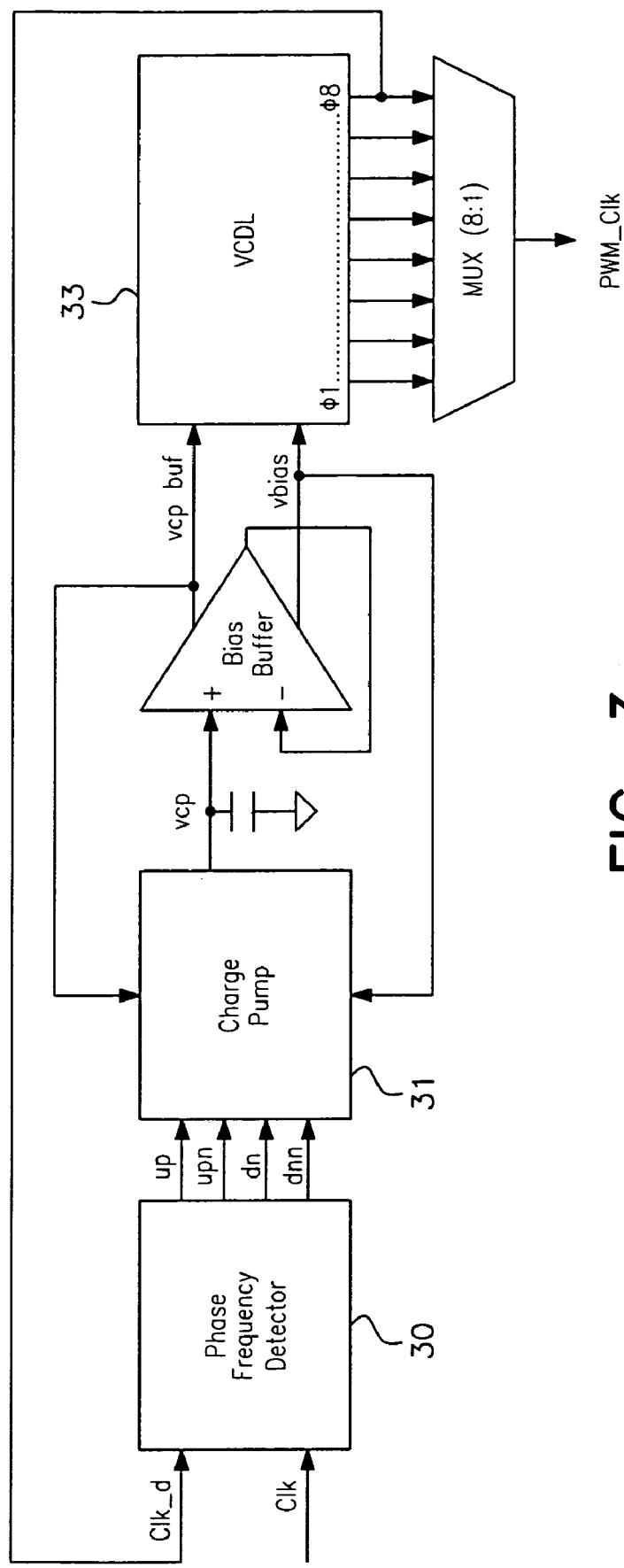
FIG. 3 is a diagram of a delay lock loop (DLL)
Figure 4:
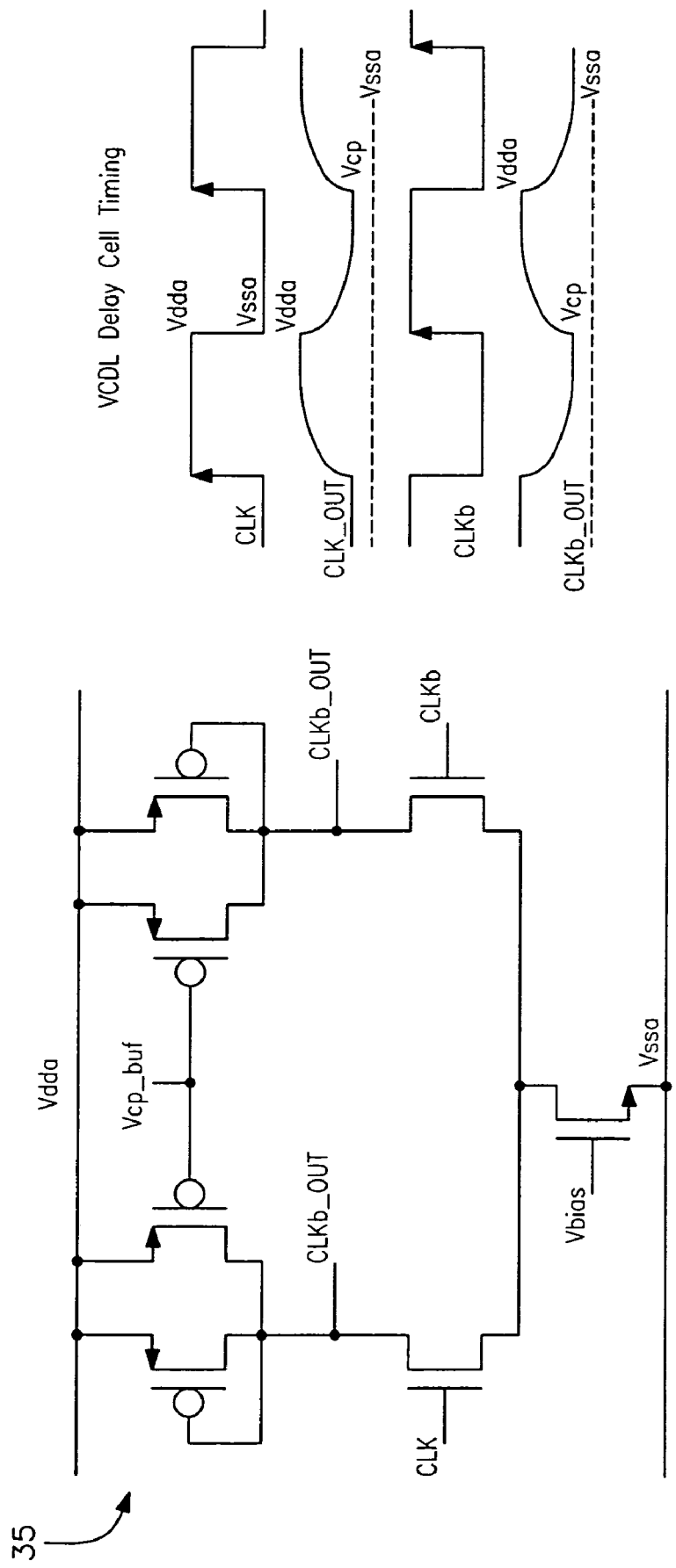
FIG. 4 is a diagram of a single voltage controlled cell and a waveform of the cell.

The DLL 4 is shown in more detail in FIG. 3. A phase frequency detector 30 feeds a charge pump 31, in turn driving a buffer 32. These together form a control circuit. The buffer 32 drives a voltage controlled delay line (VCDL) 33. A single delay cell 35 is shown in FIG. 4. The VCDL 33 incorporates the eight cascaded cells 35.

For improved jitter performance and reduced on-chip area M (number of delay cells) was chosen to be 8 for this design. The reference clock enters the first delay buffer of the VCDL and passes through the remaining series connected delay cells where the final delay stage output clk_d, is compared by the phase frequency detector to the input clk to generate a phase alignment error signal.

In operation, the DPWM 1 provides PWM switching frequency waveforms in the range of 100 kHz to 15 MHz with resolutions of 6 to 12 bits by programming the required parameters via a CPU interface and adjusting the system clock (Clk if FIG. 1) frequency $f_{clk}$ as required. These ranges of resolution and switching frequency have been achieved using a 0.35 um CMOS process to fabricate the DPWM 1.

When the DLL locks the reference input clock to the delayed clock the total delay of the delay line should be equal to exactly one period of the reference clock resulting in 8 evenly delayed phases of the clk at each buffer stage in the VCDL as shown in FIG. 5. The DLL has a lock range of 35 MHz to 145 MHz.

The programmable DPWM module 2 is a digital system operating synchronously to the DLL output clock clk_d. It supports a CPU interface allowing parameters such as duty-cycle, mode (complementary or alternating), delay/dead-times, and number of bits resolution N(6 to 12 bits) to be programmed on power up. The DSP interface allows updated duty-cycle values from a DSP feedback controller to be programmed on a switching cycle-by-cycle basis during normal operation.

The DPWM module 2 in tandem with the DLL 4 generates the PWM waveforms based on the programmed parameters at clock frequencies given by $f_{clk}=(f_{sw}*2^N)/M8$ (where N is the number of bits resolution e.g. $f_{sw}$=4 MHz @ 8-bit resolution requires $f_{clk}$=128 MHz).

An asynchronous input Stopn from an external device supports power supply protection features (such as high-speed over-current-protection). To protect the switches in the power stages activation of Stopn resets all PWM outputs to zero within a minimum delay, in this embodiment 1 ns. Depending on the end application the DPWM 1 may either temporarily reset all PWM outputs to zero, or may reset all PWM outputs to zero in a latching fashion. In the latter case, all PWM outputs remain zero until the DPWM is instructed through the CPU interface to resume normal operation.

The I/O control block 20 of the module 2 contains all the programmable registers (e.g. duty-cycle, dead/delay times, number of bits resolution) and controls all communication via the CPU or DSP to/from the DPWM 1.

The DPWM controllers 15 generate the individual PWM waveforms. PWM3 and PWM1 duty-cycles are derived versions of the PWM0 duty-cycle based on their programmed dead-times respectively.

During the high/low time generation of the PWM waveform the count sequence for the 3 least significant bits (lsb's $b_2$-$b_0$ repeats every 8 cycles within the N-bit counter. This repetition can be avoided if instead binary 8 (b'1000) is added to bits $b_n$-$b_0$ of the N-bit counter hence reducing the $f_{clk}$ by a factor of 8. Once $b_n$-$b_3$ of the N-bit counter equal $b_n$-$b_3$ of the programmed $d_k$, $b_2$-$b_0$ of $d_k$ select the delayed phase of $f_{clk}$ from the DLL to reset the PWM output (CLK_SEL signals in FIG. 1)

Referring again to FIG. 3, the DLL has a lock range of 35 MHz to 145 MHz. To achieve low jitter operation (low supply and substrate noise sensitivity), the buffer stages in the VCDL use differential clocked buffers.

Figure 6:
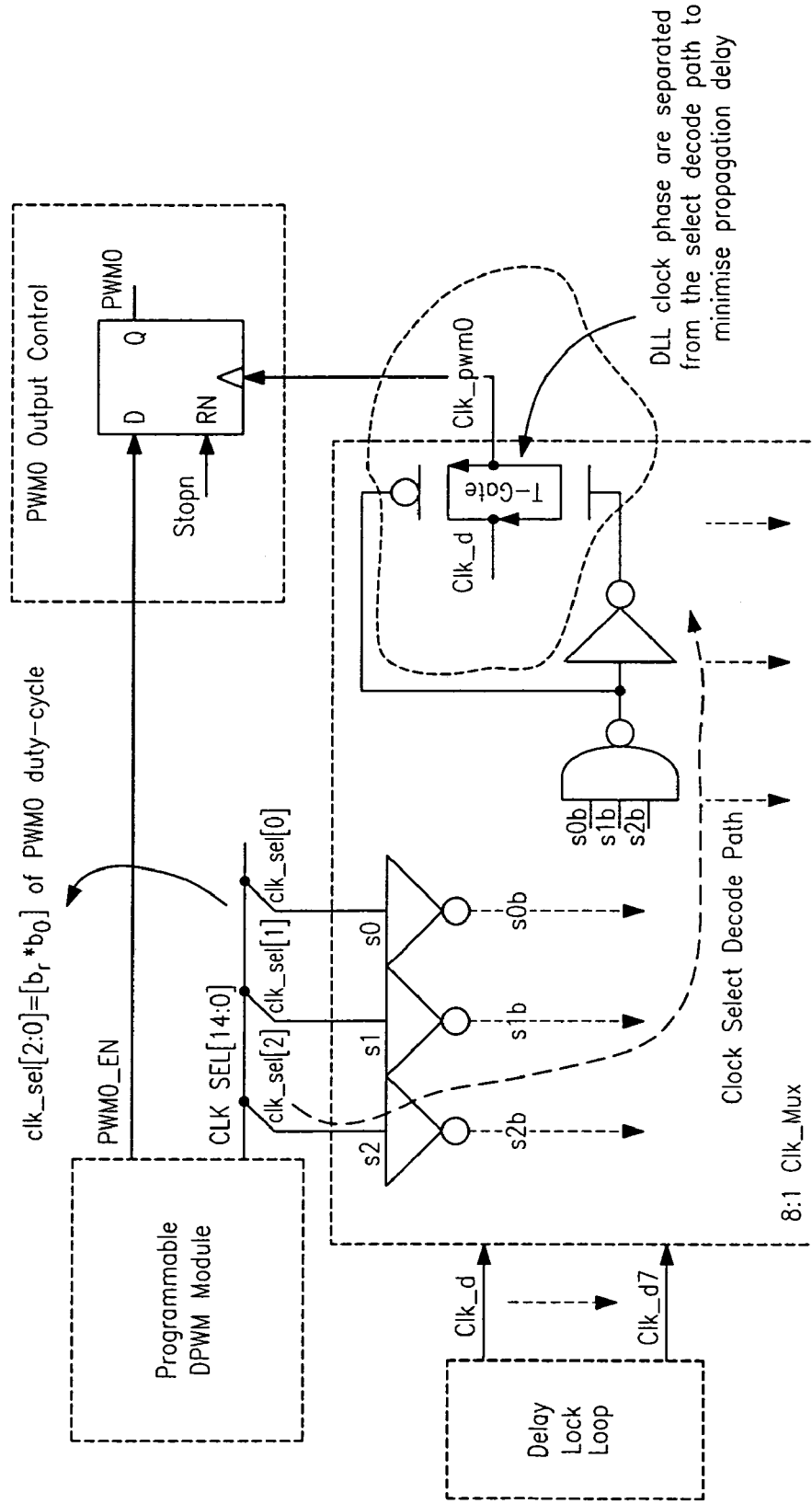
FIG. 6 shows a mux slice for DLL output.

Referring to FIG. 6, the DPWM module 2 generates the select signals for choosing which DLL clock phase should reset the PWM signal from high to low during the switching period. To minimize the propagation delay for the DLL clock phase through the 8:1 mux (providing adequate clock setup time for the PWM flip-flop) the clock phases are separated from the decode logic within the mux and passed to the output via a transmission gate. FIG. 6 shows one slice of the 8:1 mux illustrating how clk_d is fed directly to the T-Gate from the DLL.

In Switched Mode Power Converters, the output voltage and current need to be regulated. Samples of the regulated output voltage and possibly extra signals must be taken periodically (sampling), and converted into digital signals (quantisation). Within a switching cycle the preferred sampling time point is determined mainly by three (partially conflicting) requirements:
1. samples should be taken as early as possible to ease ADC and discrete controller latency requirements,
2. samples should be taken when synchronised noise in the power circuit is low, and
3. samples should be taken at the time point when the instantaneous value of the regulated signal (approximately) reflects it's average value Based on a trade-off of these requirements the DPWM 1 generates an analogue-to-digital converter (ADC) sample and hold pulse called ADC_S&H at exactly one half of the programmed duty-cycle of PWM0 every switching cycle A special case of a zero value duty-cyle is required for the ADC_S&H signal. In this case the point at which the ADC_S&H signal is generated in the switching period can be programmed through the control block.

Generally, the DPWM produces programmable duty cycles in a range from 0% to 100%. Certain switching power converter end applications may require (or may benefit from) a reduced duty cycle range. As an example, certain switching power converter topologies such as isolated forward converters may never exceed a certain maximum duty cycle or else transformer saturation may occur. Transformer saturation will typically lead to power stage destruction. Other applications may require that after startup the duty cycle never falls below a certain minimum value. A minimum duty cycle may be required by power converter secondary side circuit blocks in order to remain continuously operational. It is therefore desirable to equip the DPWM with an independently programmable upper and lower duty cycle clamp. Whenever the commanded duty cycle from the external DSP host exceeds the maximum clamp level programmed by the CPU, the DPWM will produce the maximum duty cycle. Whenever the commanded duty cycle from the DSP falls below the minimum clamp level programmed by the CPU, the DPWM will produce the minimum duty cycle. Clamping is implemented by the control block 20.

There is a wide variety of switching converter topologies using the DPWM 1 of the invention. The converter topologies may be categorised by the number of controlled power switches. Typically, the number of controlled switches ranges from one to four. The converter topologies may be further categorised by the phase relationships between the driving signals. It is an advantage of the DPWM 1 that it supports switching topologies with any number of controlled switches (typically up to four, but this is readily extended). The disclosed DPWM also supports at least two phasing modes (referred to as "Mode 0: complementary" and "Mode 1: alternating").

Figure 7:
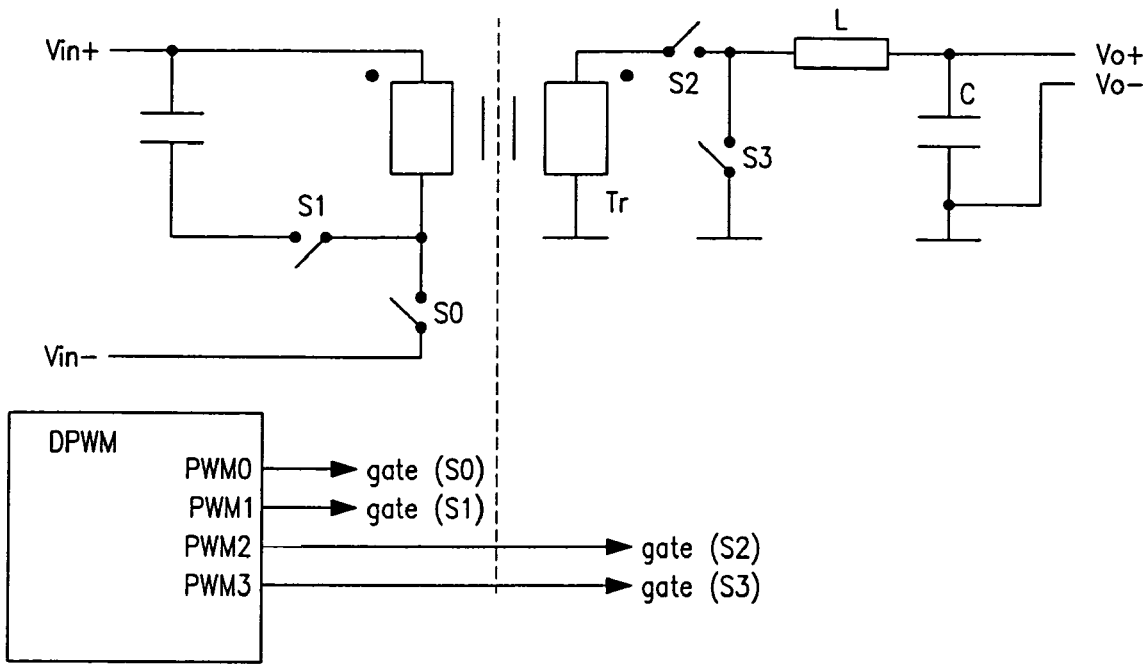
FIG. 7 is a diagram of a single-ended active clamp forward converter driven by a DPWM of the invention.
Figure 9:
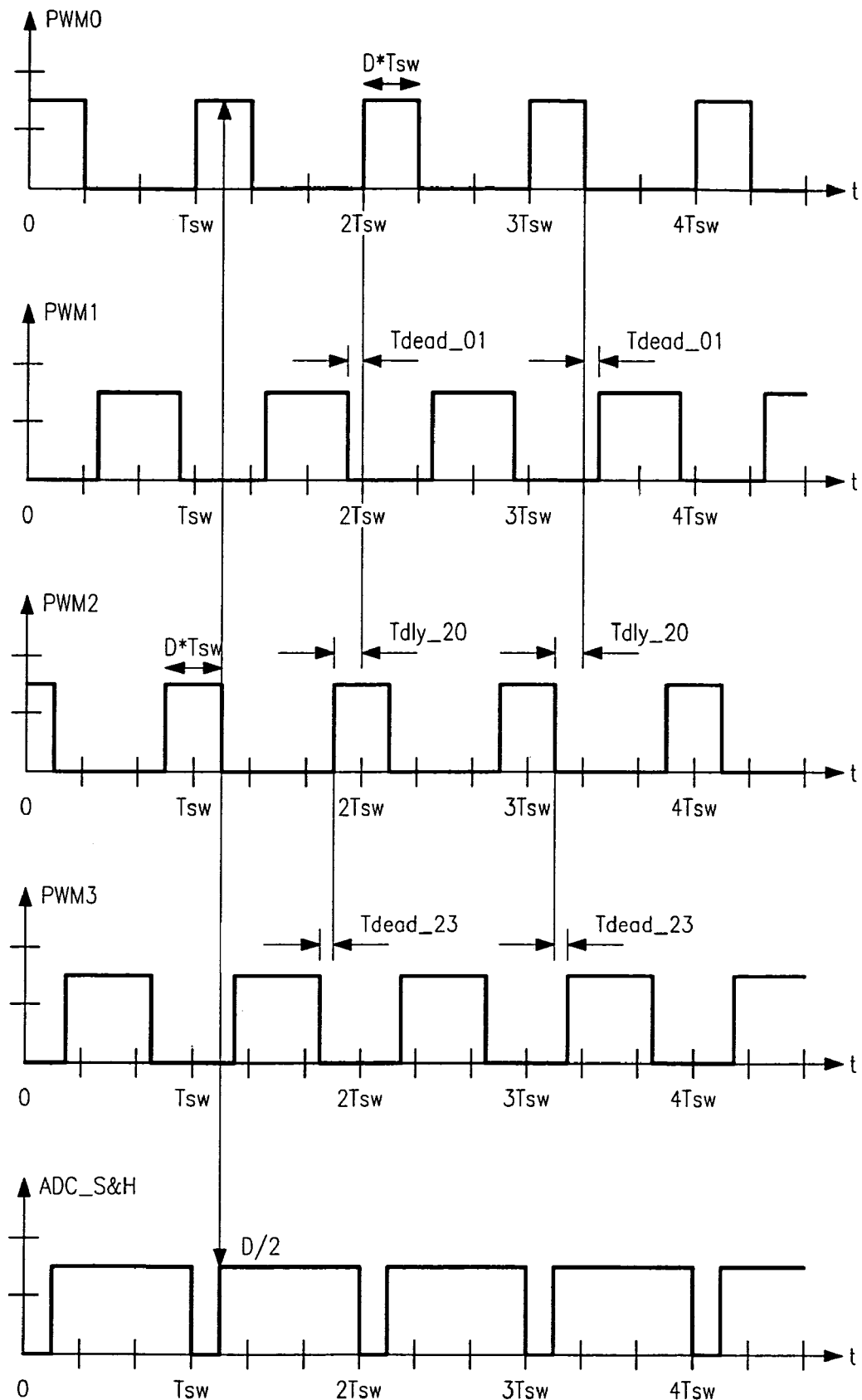
FIG. 9 is a set of DPWM output signals in Mode 0: complementary.

In complementary mode, two sets of two signals each (PWM0 and PWM1, PWM2 and PWM3) are generated as shown in FIG. 9 which are approximately out of phase with respect to each other (neglecting small dead times). The complementary mode is useful for switching converters as shown in FIG. 7 where power switches need to operate out of phase, such as active clamp forward converters and asymmetrical half bridge converters, with or without synchronous rectification.

Figure 8:
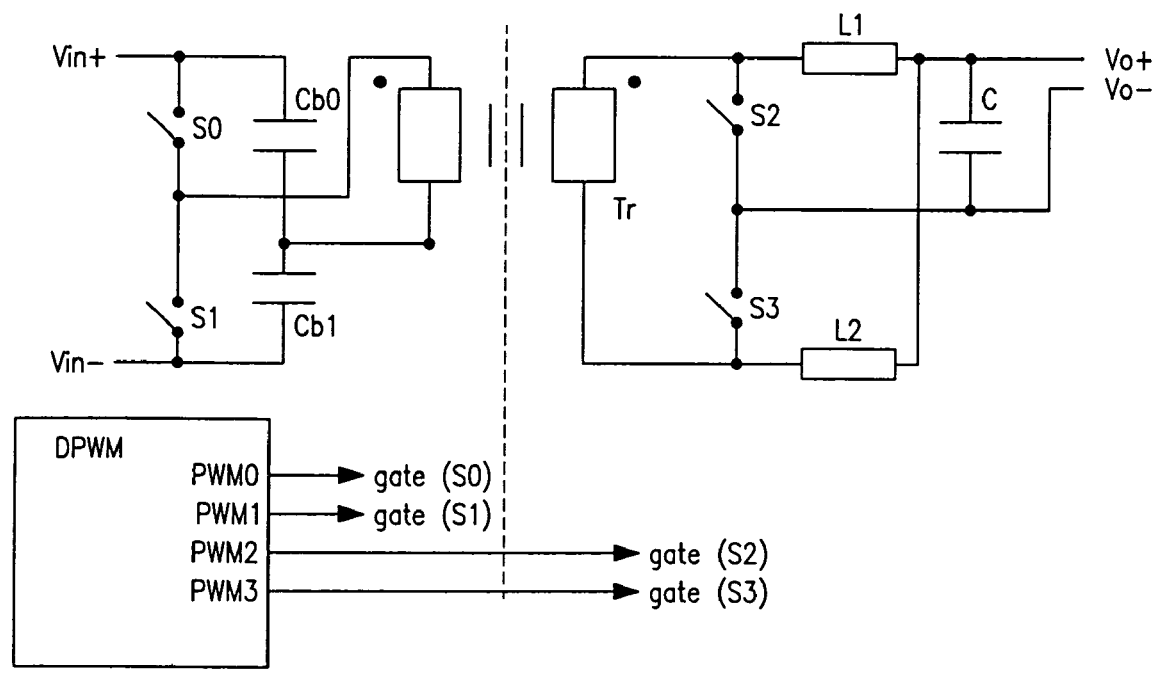
FIG. 8 is a diagram of a double-ended symmetrical half-bridge converter driven by a DPWM of the invention.
Figure 10:
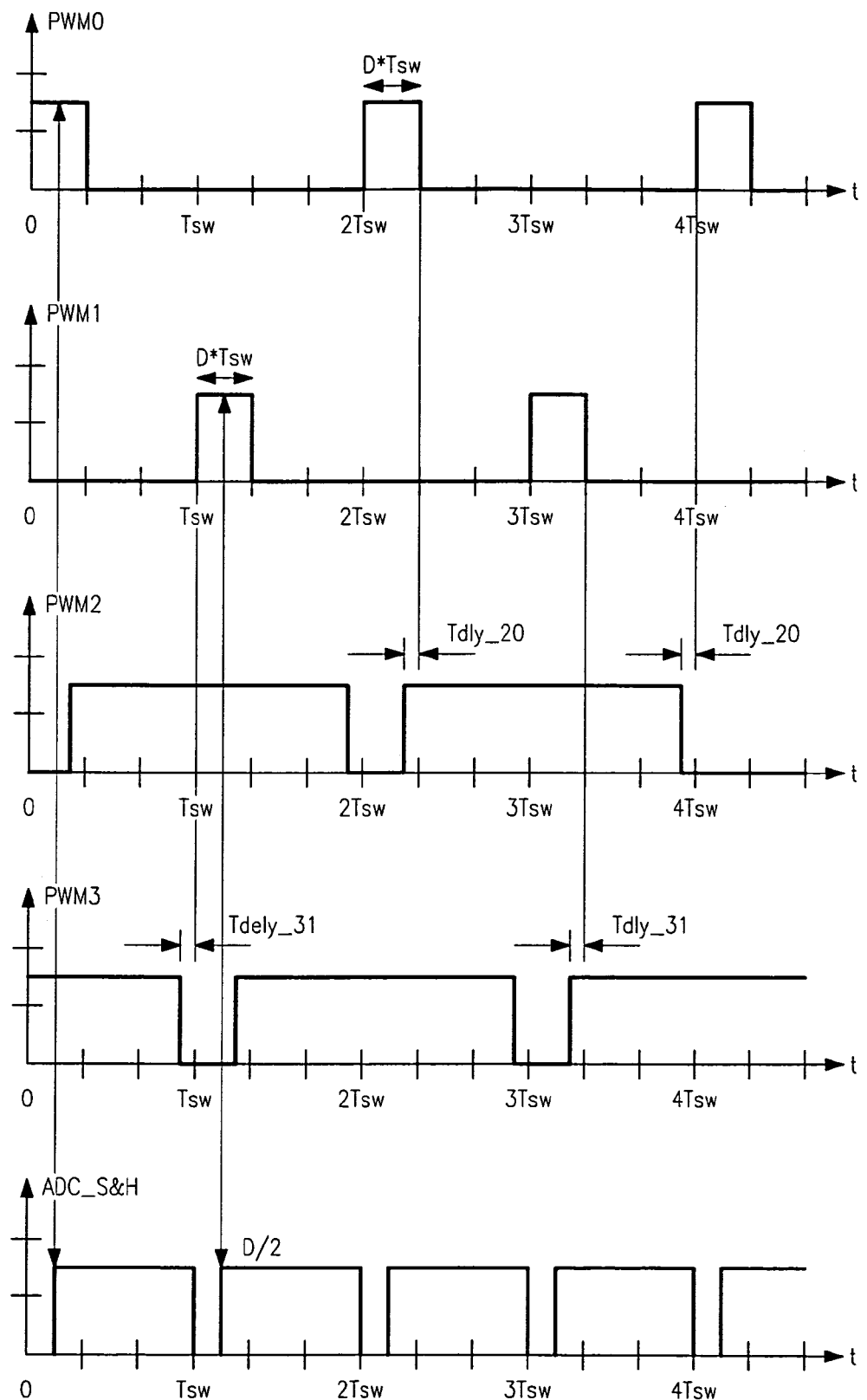
FIG. 10 is a set of DPWM output signals in Mode 1: alternating.

In alternating mode, a set of alternating signals (PWM0 and PWM1), as well as a set of overlapping signals (PWM2 and PWM3) is generated as shown in FIG. 10. The alternating mode is useful for power converters where a set of power switches need to turn on and off in an alternating fashion, and a different but synchronised set of switches need to turn on and off in an overlapping fashion. Examples for switching converters requiring the alternating mode include forward push-pull converters as well as symmetrical half bridge converters as shown in FIG. 8. In this mode the overlapping signals are useful to drive synchronous rectifiers (if present).

Switching power converters can be controlled using voltage mode or current mode control. Voltage mode control typically requires trailing edge PWM signals. However in current mode control the end application may require that the output inductor peak, average or valley current is the controlled variable.

Figure 11:
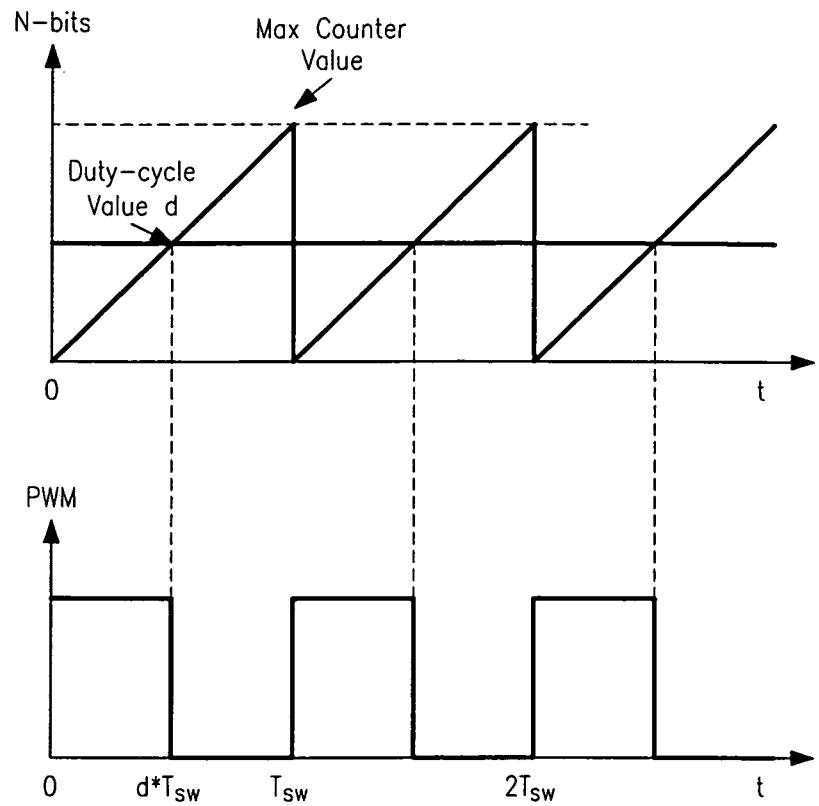
FIG. 11 is a pair of plots showing digital pulse width trailing edge modulation.

FIG. 11 illustrates trailing edge pulse width modulation where the falling edge of the PWM signal is controlled by the programmed duty-cycle. This type of modulation scheme can be used for voltage mode controllers or current mode controllers where the valley inductor current is the control variable.

Figure 12:
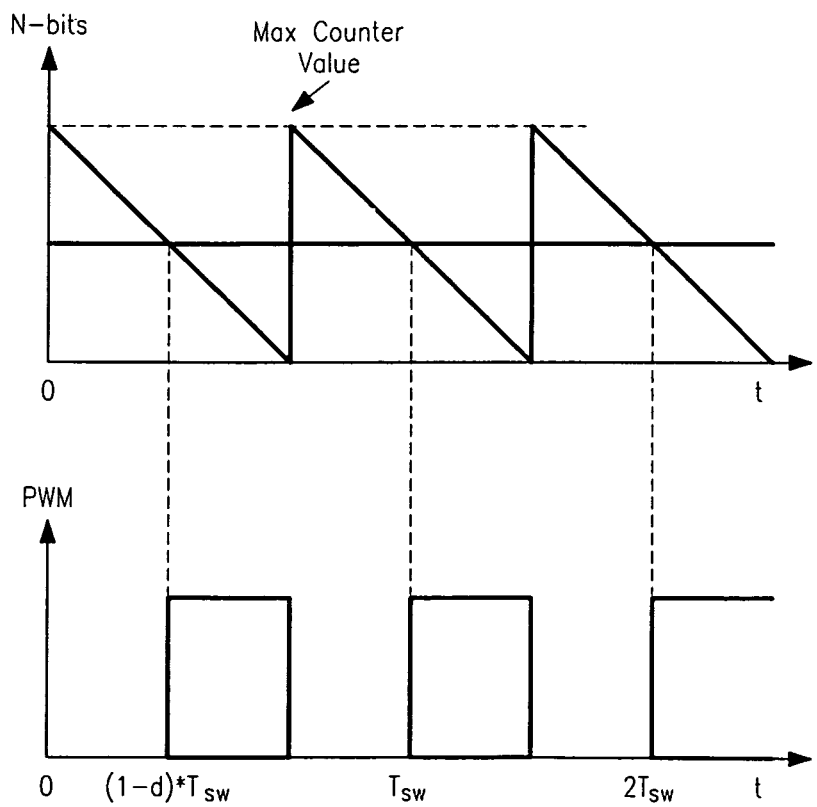
FIG. 12 shows leading edge modulation.

FIG. 12 illustrates leading edge pulse width modulation where the rising edge of the PWM signal is controlled by the programmed duty-cycle. This type of modulation scheme can be used for current mode controllers where the peak inductor current is the control variable.

Figure 13:
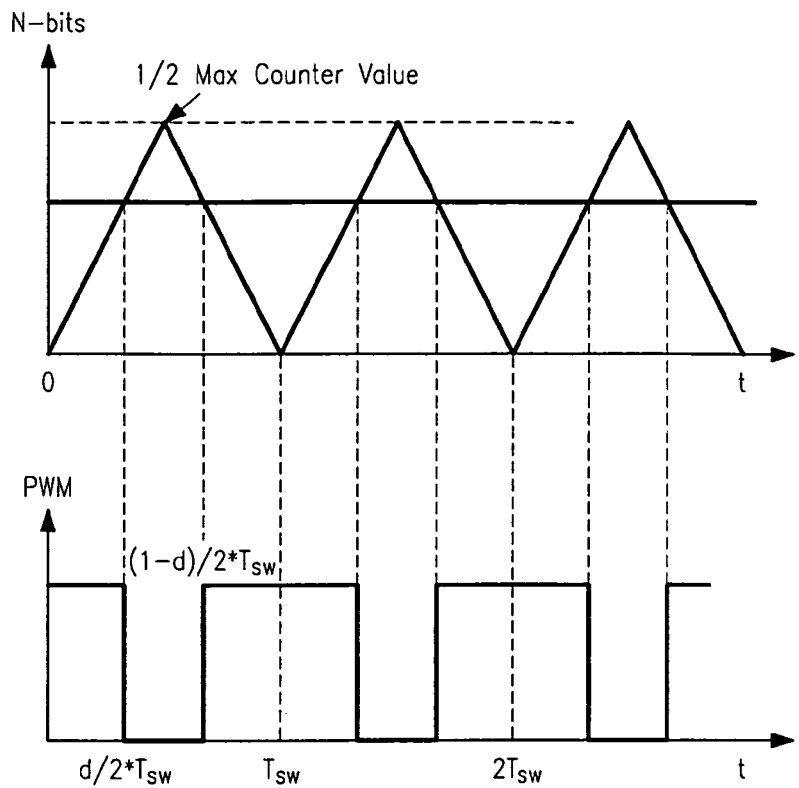
FIGS. 13 and 14 are plots showing digital pulse width trailing and leading triangle modulation respectively.

FIG. 13 illustrates trailing triangle modulation. The programmed duty-cycle d is effectively split in half The PWM signal goes high at the start of the switching cycle for this d/2 value and then goes low. The PWM signal returns high at d/2 from the end of the switching period (1−d/2).

Figure 14:
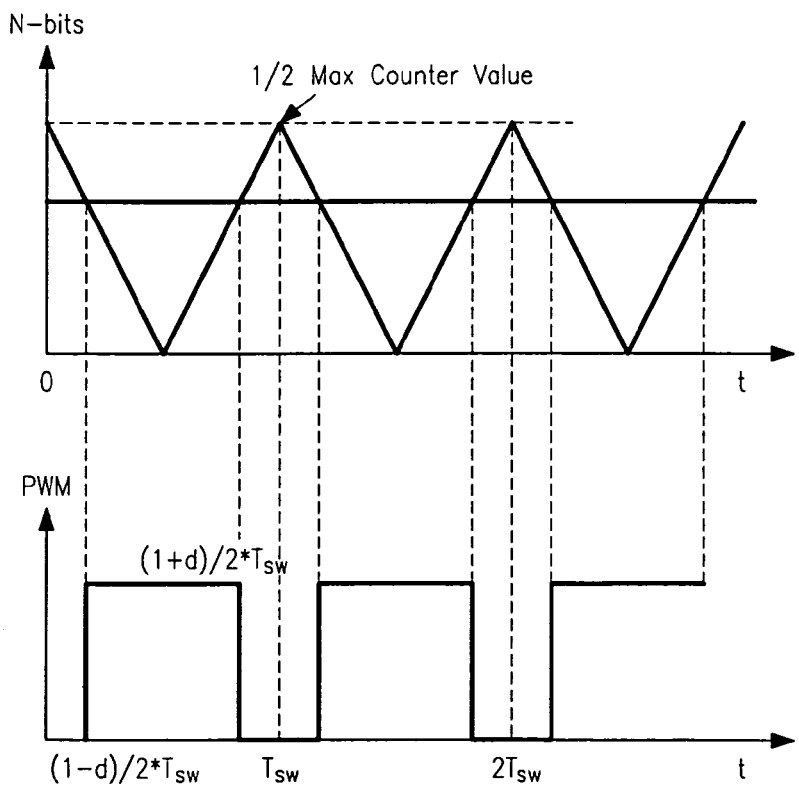

FIG. 14 illustrates leading triangle modulation.

The DLL can be modified to achieve M delay stages further increasing the resolutions and switching frequency ranges possible.

Lower resolution switching frequencies can be obtained by using the programmable DPWM module 2 standalone (i.e. without the need for the DLL) resulting in a truly all-digital DPWM solution.

Assuming an on-chip Phase-Locked Loop (PLL) the input clock to the DLL can also be made programmable.

The invention is not limited to the embodiments described but may be varied in construction and detail.

The invention claimed is:

1. A DPWM comprising a counter and a comparator, characterized in that the DPWM further comprises:
   a delay circuit for delaying a received clock signal to provide multiple clock phases, wherein the delay circuit comprises a delay-locked loop circuit having a plurality of delay cells each providing a clock phase transition within the received clock period, and
   a control block for interfacing with an external host, and a plurality of controllers for providing outputs, wherein the controllers are state machines, and
   wherein the DPWM further comprises a multiplexer for selecting a phase from the delay circuit to simulate a higher frequency clock and for providing it to an output control block.

2. The DPWM as claimed in claim 1, wherein the counter/comparator functionality is incorporated in a programmable module.

3. A DPWM comprising a counter and a comparator, characterized in that the DPWM further comprises:
   a delay circuit for delaying a received clock signal to provide multiple clock phases to simulate a higher frequency clock, wherein the delay circuit comprises a delay-locked loop circuit having a plurality of delay cells each providing a clock phase transition within the received clock period, and
   a control block for interfacing with an external host, and a plurality of controllers for providing outputs, wherein the controllers are state machines;
   wherein each of the controllers operates independently to provide a PWM output based on parameters from the control block.

4. The DPWM as claimed in claim 1, wherein each of the controllers operates independently to provide a PWM output based on parameters from the control block; and wherein the programmable module further comprises a component to provide an ADC sample and hold output signal.

5. The DPWM as claimed in claim 4, wherein an ADC sample and hold signal is produced from a pre-programmed control register when the duty-cycle value is zero.

6. A DPWM comprising a counter and a comparator, characterized in that the DPWM further comprises:
   a delay circuit for delaying a received clock signal to provide multiple clock phases to simulate a higher frequency clock, wherein the delay circuit comprises a delay-locked loop circuit having a plurality of delay cells each providing a clock phase transition within the received clock period, and
   a control block for interfacing with an external host, and a plurality of controllers for providing outputs, wherein the controllers are state machines;
   wherein the counter/comparator functionality is incorporated in a programmable module; and wherein the programmable module forces all PWM outputs to zero in less than ins in response to an asynchronous stop input.

7. A DPWM comprising a counter and a comparator, characterized in that the DPWM further comprises:
   a delay circuit for delaying a received clock signal to provide multiple clock phases to simulate a higher frequency clock, wherein the delay circuit comprises a delay-locked loop circuit having a plurality of delay cells each providing a clock phase transition within the received clock period, and
   a control block for interfacing with an external host, and a plurality of controllers for providing outputs, wherein the controllers are state machines;
   wherein the counter/comparator functionality is incorporated in a programmable module; and wherein the duty-cycle can be clamped to programmable minimum and maximum values.

8. The DPWM as claimed in claim 1, wherein the counter/comparator functionality is incorporated in a programmable module; and wherein the module generates multiple PWM outputs from programmed parameters.

9. The DPWM as claimed in claim 1, wherein the counter/comparator functionality is incorporated in a programmable module; and wherein the duty-cycle is programmable from 0-100%.

10. The DPWM as claimed in claim 1, wherein the counter/comparator functionality is incorporated in a programmable module; and wherein the dead/delay times between the PWM outputs are programmable and are bit-wise accurate to a programmed resolution.

11. The DPWM as claimed in claim 1, wherein the counter/comparator functionality is incorporated in a programmable module; and wherein the PWM output signals can be programmed to occur in a complementary or alternating sequence Mode 0 and Mode 1, respectively.

12. A DPWM comprising a counter and a comparator, characterized in that the DPWM further comprises:
   a delay circuit for delaying a received clock signal to provide multiple clock phases to simulate a higher frequency clock, wherein the delay circuit comprises a delay-locked loop circuit having a plurality of delay cells each providing a clock phase transition within the received clock period, and
   a control block for interfacing with an external host, and a plurality of controllers for providing outputs, wherein the controllers are state machines;
   wherein the counter/comparator functionality is incorporated in a programmable module; and wherein the DPWM further comprises a phase-locked loop to render the operating clock of the DPWM to be programmable.

13. The DPWM as claimed in claim 1, wherein the counter/comparator functionality is incorporated in a programmable module; and wherein the operation of each DPWM controller is synchronous to an operating clock.

14. The DPWM as claimed in claim 1, wherein the counter/comparator functionality is incorporated in a programmable module; and wherein the modulation type is programmable.

15. The DPWM as claimed in claim 14, wherein the programmed modulation types include trailing edge, leading edge, trailing triangle, and leading triangle.

16. The DPWM as claimed in claim 1, wherein the counter/comparator functionality is incorporated in a programmable module; and wherein the duty-cycle can be programmed either from a host CPU or a discrete feedback controller.

17. The DPWM as claimed in claim 1, wherein the resolution of the PWM signals are programmable from 6-12 bits.

18. The DPWM as claimed in claim 1, wherein the DPWM has a switching frequency range from 100 KHz-15 MHz.

19. The DPWM as claimed in claim 2, wherein the programmable module can work independently from the DLL to generate lower frequency/resolution switching frequencies yielding a true digital DPWM.

20. The DPWM as claimed in claim 1, wherein the counter/comparator functionality is incorporated in a programmable module; and wherein the device can be programmed to enter a power-down mode.

21. A DPWM comprising a counter and a comparator, characterized in that the DPWM further comprises:
   a delay circuit for delaying a received clock signal to provide multiple clock phases to simulate a higher frequency clock, wherein the delay circuit comprises a delay-locked loop circuit having a plurality of delay cells each providing a clock phase transition within the received clock period, and a control block for interfacing with an external host, and a plurality of controllers for providing outputs, wherein the controllers are state machines;

wherein the device can produce a synchronisation signal to other DPWM upon starting to generate PWM output signals.

22. The DPWM of claim 1 wherein said DPWM controls a plurality of switches.

23. The DPWM as claimed in claim 22, wherein the DPWM provides complementary mode switch control outputs.

24. The DPWM as claimed in claim 22, wherein the DPWM provides alternating mode switch control outputs.

* * * * *